United States Patent [19]
Tanaka et al.

[11] Patent Number: 5,689,749
[45] Date of Patent: Nov. 18, 1997

[54] APPARATUS FOR DEVELOPING A RESIST-COATED SUBSTRATE

[75] Inventors: Hideya Tanaka; Norimitsu Morioka; Kosuke Yoshihara, all of Kumamoto, Japan

[73] Assignees: Tokyo Electron Limited, Tokyo; Tokyo Electron Kyushu Limited, Tosu, both of Japan

[21] Appl. No.: 521,845

[22] Filed: Aug. 31, 1995

[30] Foreign Application Priority Data

Aug. 31, 1994 [JP] Japan .................................. 6-230627

[51] Int. Cl.⁶ ........................................................ G03D 3/02
[52] U.S. Cl. ............................................. 396/611; 396/627
[58] Field of Search ........................... 396/611, 627; 430/322, 434; 156/345, 626.1, 639.1, 646.1; 134/1, 3, 31, 33, 34, 153, 184, 198; 355/43–45, 53, 77

[56] References Cited

U.S. PATENT DOCUMENTS 5,555,234  9/1996  Sugimoto ................................ 396/627

FOREIGN PATENT DOCUMENTS 3-34207   5/1991  Japan .
6-310418  11/1994 Japan .
7-45514   2/1995  Japan .

*Primary Examiner*—D. Rutledge
*Attorney, Agent, or Firm*—Oblon, Spivak, McClelland, Maier & Neustadt, P.C.

[57] ABSTRACT

A developing apparatus for developing a photoresist-coated substrate comprises a spin chuck having a supporting surface smaller in size than the substrate and adapted to be spin-driven with the photoresist-coated substrate surface held upward, a cup surrounding the spin chuck, a developing solution nozzle for applying a developing solution on the photoresist-coated substrate held on the spin chuck, a first washing solution nozzle for applying a washing solution to the photoresist-coated surface of the substrate held on the spin chuck, a second washing solution nozzle for applying the washing solution to a rear surface of the substrate on the spin chuck, a liquid seal ring mounted substantially coaxial with the spin chuck and having a diameter greater than the supporting surface of the spin chuck and smaller than the substrate, and a liquid film forming section provided on an upper end of the liquid seal ring and located near and opposite a peripheral edge portion of a rear surface of the substrate on the spin chuck to provide a clearance relative to the peripheral edge portion of the rear surface of the substrate, in which the liquid film forming section includes a first wall portion situated substantially orthogonal to the rear surface of the substrate and in an outwardly facing relation, and a second wall portion gently inclined relative to the rear surface of the substrate and situated in an inwardly facing relation.

13 Claims, 12 Drawing Sheets

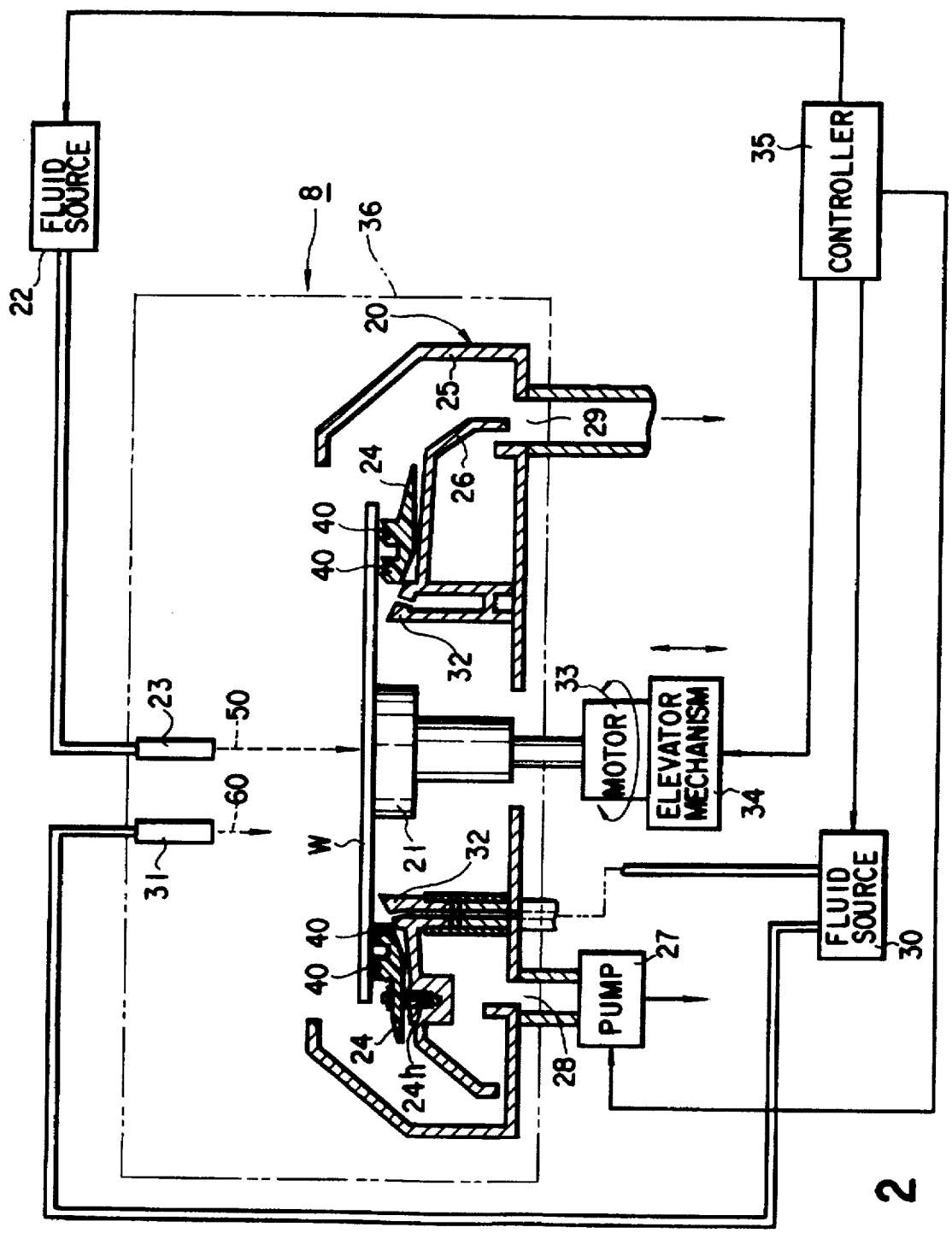
F I G. 2

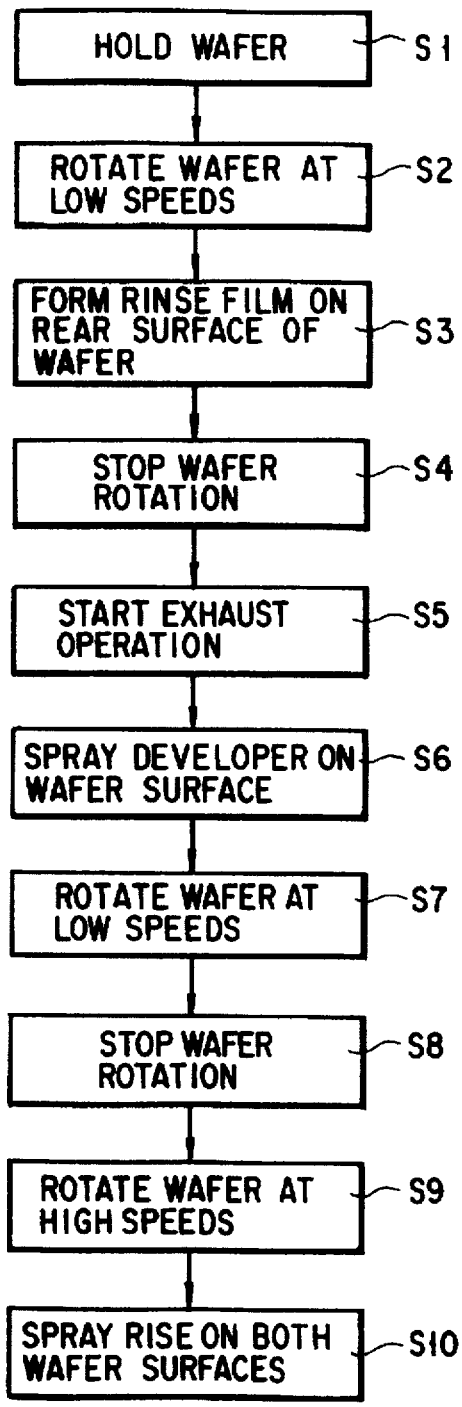
F I G. 7
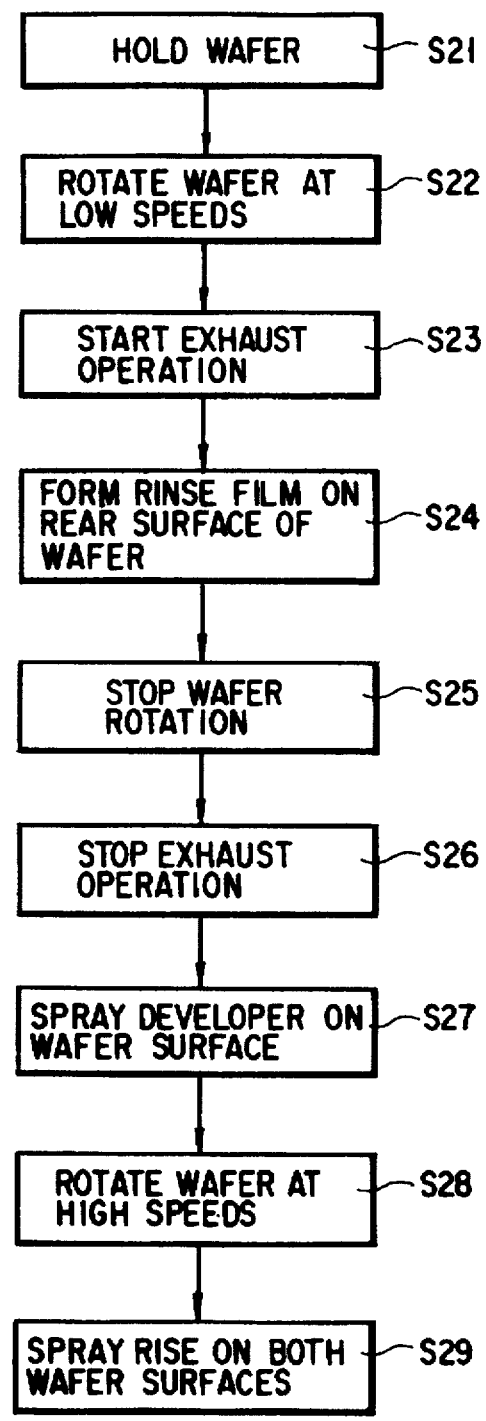
F I G. 16

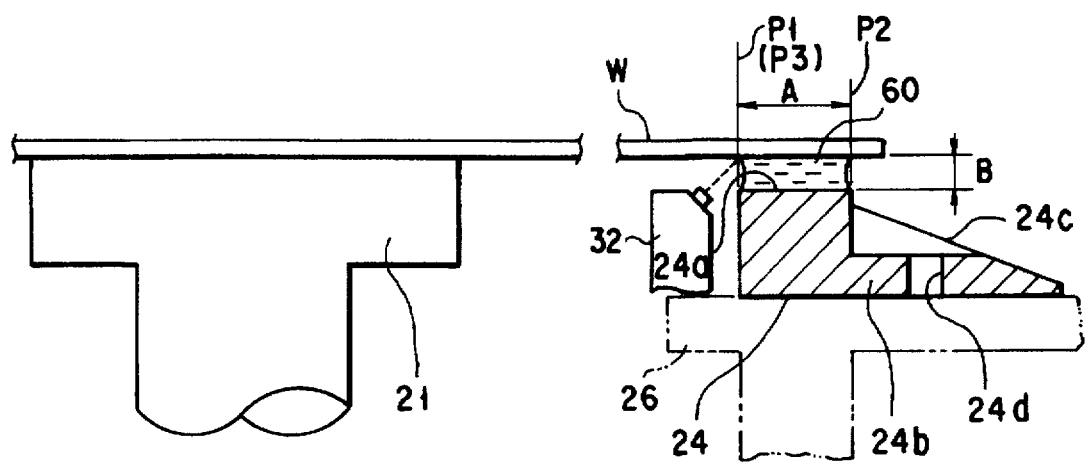
F I G. 12
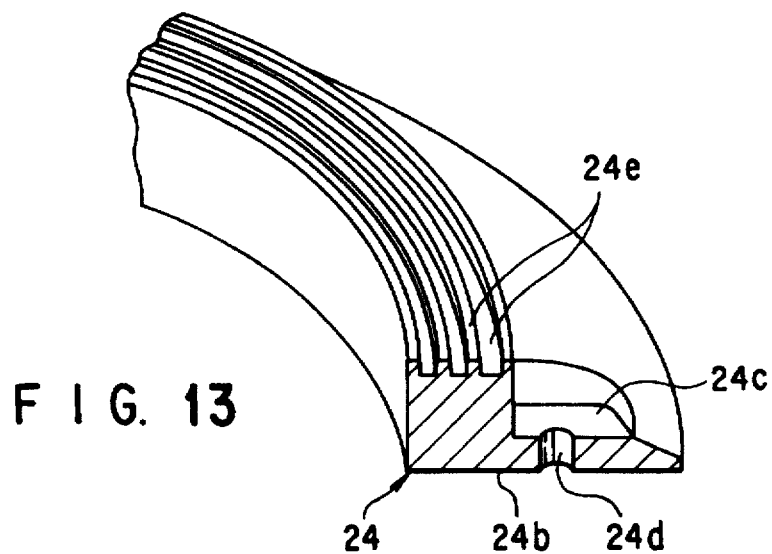
F I G. 13
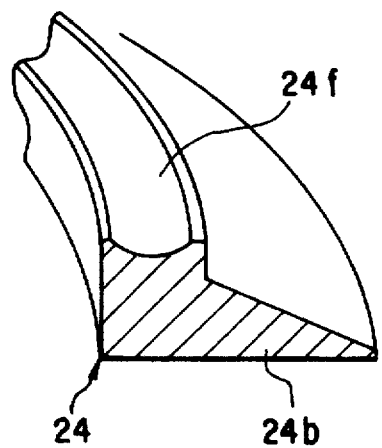
F I G. 14
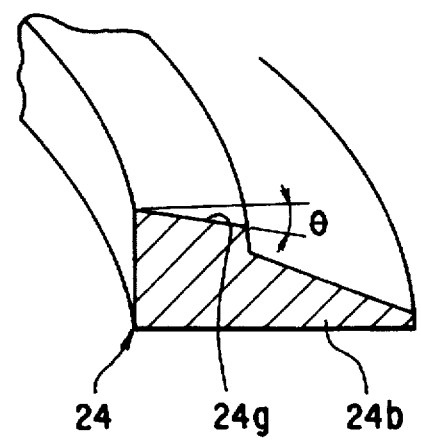
F I G. 15

APPARATUS FOR DEVELOPING A RESIST-COATED SUBSTRATE

FIELD OF THE RELATED ART

The present invention relates to an apparatus and method for developing a substrate, such as a substrate wafer, and, in particular, to a developing apparatus and developing method for developing a substrate while preventing a developing solution (developer) from being deposited on the rear surface side of a substrate.

DESCRIPTION OF THE RELATED ART

In the manufacture of a semiconductor device with the use of a photolithography technique, a photoresist is coated on one surface of a semiconductor wafer, a circuit pattern is transferred to the photoresist and the photoresist is subjected to developing process. In the developing process, a developing solution is applied to the resist-coated surface of the wafer, while the wafer is spin-driven. However, the developing solution flows from the resist-coated surface side onto the rear surface side of the wafer around a peripheral edge. When this "flowing-around" problem occurs, the developing solution is deposited on the wafer's rear surface and spin chuck and the deposited developing solution flows along a conveying arm and support base to cause contamination.

In order to prevent such "flowing around" problem, a washing solution is continuously jetted on the whole rear surface of the wafer on a conventional apparatus. With the conventional apparatus, however, the resist-coated surface (to-be-processed surface) of the wafer is thermally affected due to the continuous jetting of the washing solution onto the rear surface of the wafer so that the developing process occurs unevenly.

In JPN PAT APPLN KOKOKU PUBLICATION No. 3-34207 and JPN PAT APPLN KOKAI PUBLICATION No. 7-45514, an annular small clearance is created at the peripheral edge portion of the rear surface of a wafer and a developing solution is trapped by the annular small clearance. By doing so, the developing solution is prevented from flowing up to a central region at the rear surface of the wafer. With such apparatus as set out above, however, the developing solution cannot be completely removed from the annular small clearance and the developing solution stays deposited on the peripheral edge portion of the rear surface of the wafer. It is, therefore, necessary to remove the wafer from the spin chuck and wash the rear surface of the wafer at a subsequent step. There occurs a lowering in throughout of wafers.

SUMMARY OF THE INVENTION

It is accordingly the object of the present invention to provide an apparatus and method which can develop a resist-coated substrate in high throughout without involving any contamination by a developing solution on the rear surface (an untreated surface) of the substrate as well as on that surface of a spin chuck where the substrate is held in place.

JPN PAT APPLN KOKAI PUBLICATION No. 6-310418 discloses the technique of creating a continuous liquid film on the peripheral edge portion of the rear surface of a wafer and removing a developing solution, mixed in the liquid film, by jetting a washing solution. In this technique, however, the developing solution cannot be completely removed from that liquid film and remains on the rear surface of the wafer. In this situation, strenuous research has been made by the inventors on a structure of a liquid film forming means by which less developing solution is mixed into a washing solution film. As a result, the inventors have completed the following invention.

In one aspect of the present invention, there is provided a developing apparatus for developing a photoresist-coated on substrate, comprising:

a spin chuck having a mount smaller in size than the substrate and adapted to be spin-driven with the photoresist-coated substrate surface held upward;

a cup surrounding the substrate on the mount of the spin chuck;

a developing solution nozzle for applying a developing solution on the photoresist-coated substrate held on the mount;

a first washing solution nozzle for applying a washing solution to the photoresist-coated surface of the substrate held on the mount;

a second washing solution nozzle for applying the washing solution to a rear surface of the substrate on the mount;

a liquid seal ring mounted substantially coaxial with the spin chuck and having a diameter greater than the mount and smaller than the substrate; and a liquid film forming section provided on an upper end of the liquid seal ring and located near and opposite a periphery of a rear surface of the substrate on the mount to provide a clearance relative to the periphery of the rear surface of the substrate, wherein the liquid film forming section includes a first wall portion situated substantially orthogonal to the rear surface of the substrate and in an outwardly facing relation, and a second wall portion gently inclined relative to the rear surface of the substrate and situated in an inwardly facing relation, the liquid film forming section creates an annular continuous washing solution film at the clearance, the first wall portion prevents the developing solution from intruding more inward than the clearance, and the second wall portion promotes a discharge of the developing solution from the clearance.

In another aspect of the present invention, there is provided a developing apparatus for developing a photoresist-coated substrate, comprising:

a spin chuck having a mount smaller in size than the substrate and adapted to be spin-driven with the photoresist-coated substrate surface held upward;

a cup surrounding the substrate on the mount of the spin chuck;

a developing solution nozzle for applying a developing solution on the photoresist-coated substrate held on the mount;

a first washing solution nozzle for applying a washing solution to the photoresist-coated surface of the substrate held on the mount;

a second washing solution nozzle for applying the washing solution to a rear surface of the substrate on the spin chuck;

a liquid seal ring mounted substantially coaxial with the spin chuck and having a diameter greater than the mount and smaller than the substrate; and a liquid film forming section provided on an upper end of the liquid seal ring and located near and opposite a periphery of a rear surface of the substrate to provide a clearance relative to the periphery of the rear surface of the substrate, wherein the liquid film forming section has a substantially flat surface to create an annular continuous washing solution film at the clearance.

In another aspect of the present invention, there is provided a developing method for developing a photoresist-coated substrate, comprising the steps of:

(a) supporting the photoresist-coated substrate on a spin chuck in a chamber with the photoresist-coated substrate held upward and facing a liquid film forming means at an area near a periphery of a rear surface of the substrate to define a clearance between the liquid film forming means and the periphery of the rear surface of the substrate;

(b) starting an exhaust operation in the chamber and, while rotating the substrate at a first rotation speed, supplying a washing solution to the clearance to create an annular continuous washing solution film;

(c) while stopping the rotation of the substrate, stopping an exhaust operation in the chamber and applying a developing solution to the photoresist-coated surface of the substrate to develop the coated photoresist in a hermetically sealed chamber; and (d) while rotating the substrate at a second rotation speed, applying a washing solution on both the surfaces of the substrate and removing the developing solution from both surfaces of the substrate.

In another aspect of the present invention, there is provided a developing method for developing a photoresist-coated substrate, comprising the steps of:

(p) supporting the photoresist-coated substrate on a spin chuck with the photoresist-coated substrate held upward and facing a liquid film forming means at an area near a periphery of a rear surface of the substrate to define a clearance between the liquid film forming means and the periphery of the rear surface of the substrate;

(q) while rotating the photoresist-coated substrate at a first rotation speed, supplying a washing solution to the clearance to create an annular continuous washing solution film;

(r) temporarily stopping the rotation of the substrate and, while applying a developing solution on the photoresist-coated surface of the substrate, rotating the substrate at a second rotation speed;

(s) stopping the rotation of the substrate and allowing the developing solution to act upon the coated-photoresist on the substrate in a stopped state of the substrate; and (t) while rotating the substrate at a third rotation speed, applying the washing solution on both surfaces of the substrate and removing the developing solution from both the surfaces of the substrate.

As shown in FIG. 10, when the width A ($A_2$) of the top face of the liquid seal ring is smaller than 5 mm, a liquid film is broken and no continuous liquid film is created. While, on the other hand, the width A ($A_2$) is greater than 15 mm, a developing solution is excessively mixed into a resultant thick liquid film so that, rather, more developing solution stays deposited on the rear surface side of the substrate. From this reason it will be necessary to set the width A of the top face of the liquid seal ring to a range 5 to 15 mm.

Further, when a clearance B between the substrate and the top face of the liquid seal ring is smaller than 0.5 mm, the substrate upon being spin-driven at a high speed is contacted with the top face of the liquid seal ring, thus producing particles or damaging the substrate. When, on the other hand, the clearance B is greater than 1.5 mm, a liquid film becomes unstable. It is, therefore, necessary that the clearance B between the substrate and the top face of the liquid seal ring be made in a range of 0.5 to 1.5 mm.

BRIEF DESCRIPTION OF THE DRAWINGS

FIG. 2 is a block diagram, in cross-section, showing a developing apparatus according to an embodiment of the present invention;

FIG. 7 is a flow chart showing a developing method using the embodiment of the present invention;

FIG. 12 is a cross-sectional view, partly taken away, showing a wafer on a spin chuck, a liquid seal ring and second washing liquid nozzles;

FIG. 13 is a perspective view, partly taken away, showing a liquid seal ring of another embodiment of the present invention;

FIG. 14 is a perspective view, partly taken away, showing a liquid seal ring of another embodiment of the present invention;

FIG. 15 is a perspective view, partly taken away, showing a liquid seal ring of another embodiment of the present invention;

FIG. 16 is a flow chart showing a developing method using another embodiment of the present invention;

DESCRIPTION OF THE PREFERRED EMBODIMENTS

Preferred embodiments of the present invention will be explained below with reference to the accompanying drawings. In these embodiments, an explanation will be given about a developing apparatus of the present invention applied to a coat/develop processing system for subjecting a resist on a semiconductor wafer to coat/develop processing.

Figure 1:
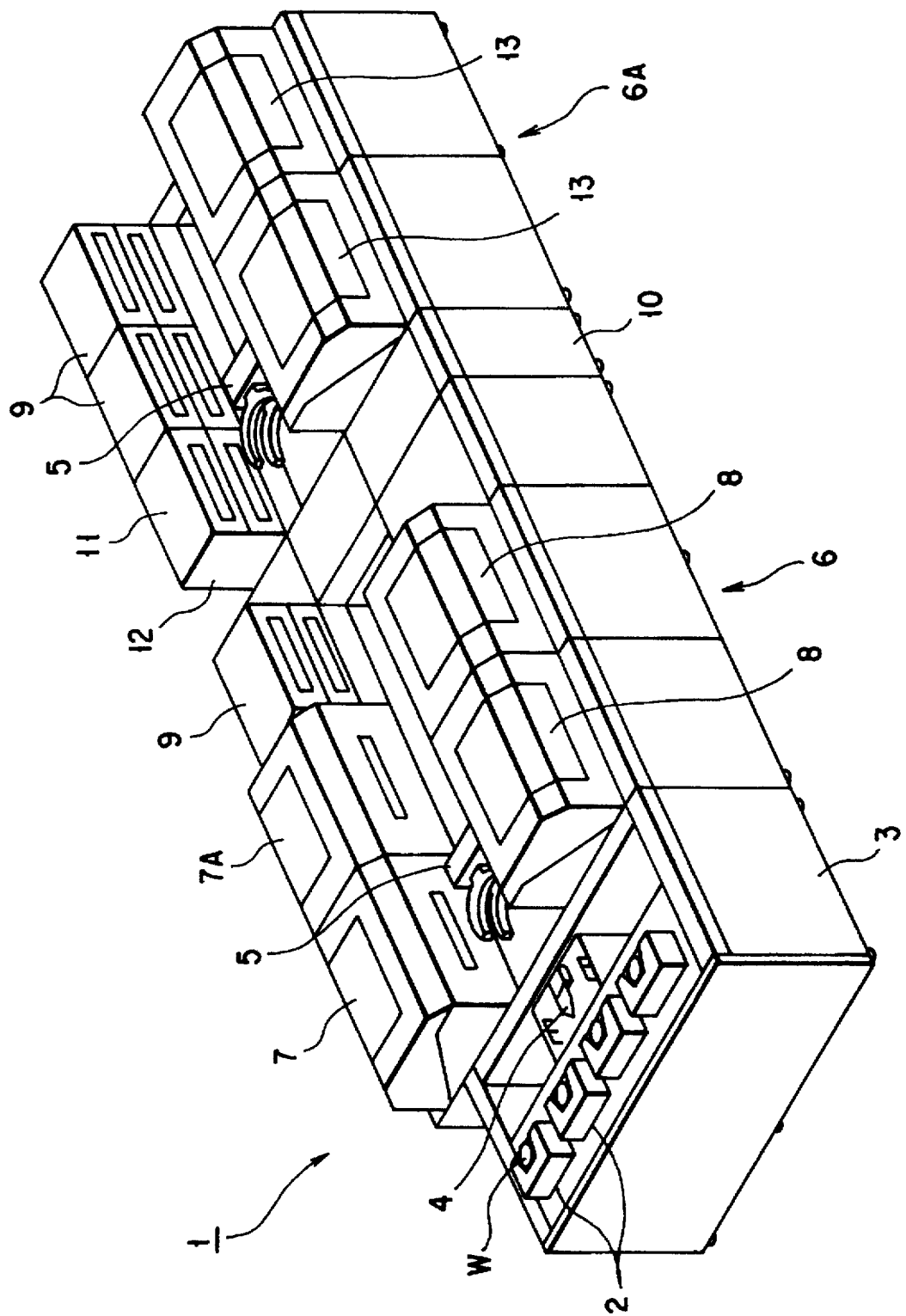
FIG. 1 is a perspective view showing a coat/develop processing system for a semiconductor wafer.

As shown in FIG. 1, the resist coat/develop processing system 1 includes a cassette station 3 and two processing sections 6 and 6A. An assistant arm 4 is provided on a cassette station 3 to allow a wafer W to be loaded/unloaded and positioned. The first processing section 6 includes processing units 7, 7A, 8 and 9, a middle passage and an arm robot 5. Two developing apparatuses 8 are provided in the first processing unit 6. The second processing section 6A includes processing units 9, 11, 12 and 13, a middle passage and an arm robot 5.

The cassette station 3 is connected to a front side of the first processing section 6 and a semiconductor wafer W is loaded by the robot 5 from the cassette station 3 into the first processing unit 6. The first and second processing units 6 and 6A are connected by a transfer station 10 to each other so that the semiconductor wafer W is passed to an associated unit by two arm robots 5. An exposure device (not shown) is connected to a rear side of the second processing section 6A.

The first processing section 6 includes, on one side of the middle passage, a brush scrubber unit 7, washing unit 7A and baking unit 9 and, on the other side of the middle passage, two developing apparatuses 8. The second processing section 6A includes, on one side of the middle passage, an adhesion processing unit 11, a cooling unit 12 and two baking units 9 and, on the other side of the middle passage, two resist coating units 13. The adhesion processing unit 11 and cooling unit 12 are each of a vertical stacking type. Further, the two baking units 9 are each of a two-stage vertical-stacking type.

The developing apparatus 8 will be explained with reference to FIGS. 2 to 6.

A spin chuck 21 is provided within a chamber 36 of the developing apparatus 8. The spin chuck 21 is equipped with a vacuum suction mechanism, not shown, for substantially horizontally retaining a wafer W in place. The spin chuck 21 is connected to a rotation shaft of a motor 33. The spin chuck 21 is liftably supported by an elevator mechanism 34. Respective power supply switches of the motor 33, elevator mechanism 34 and vacuum pump 27 are connected to the output side of a controller 35.

The spin chuck 21 is surrounded with a cylindrical cup 20. A gas exhaust passage 28 and a liquid discharge passage 29 are provided at a bottom of the cup 20. The gas exhaust passage 28 is connected to a suction port of the vacuum pump 27. The liquid discharge passage 29 is connected to the suction port of another pump not shown.

Figure 3:
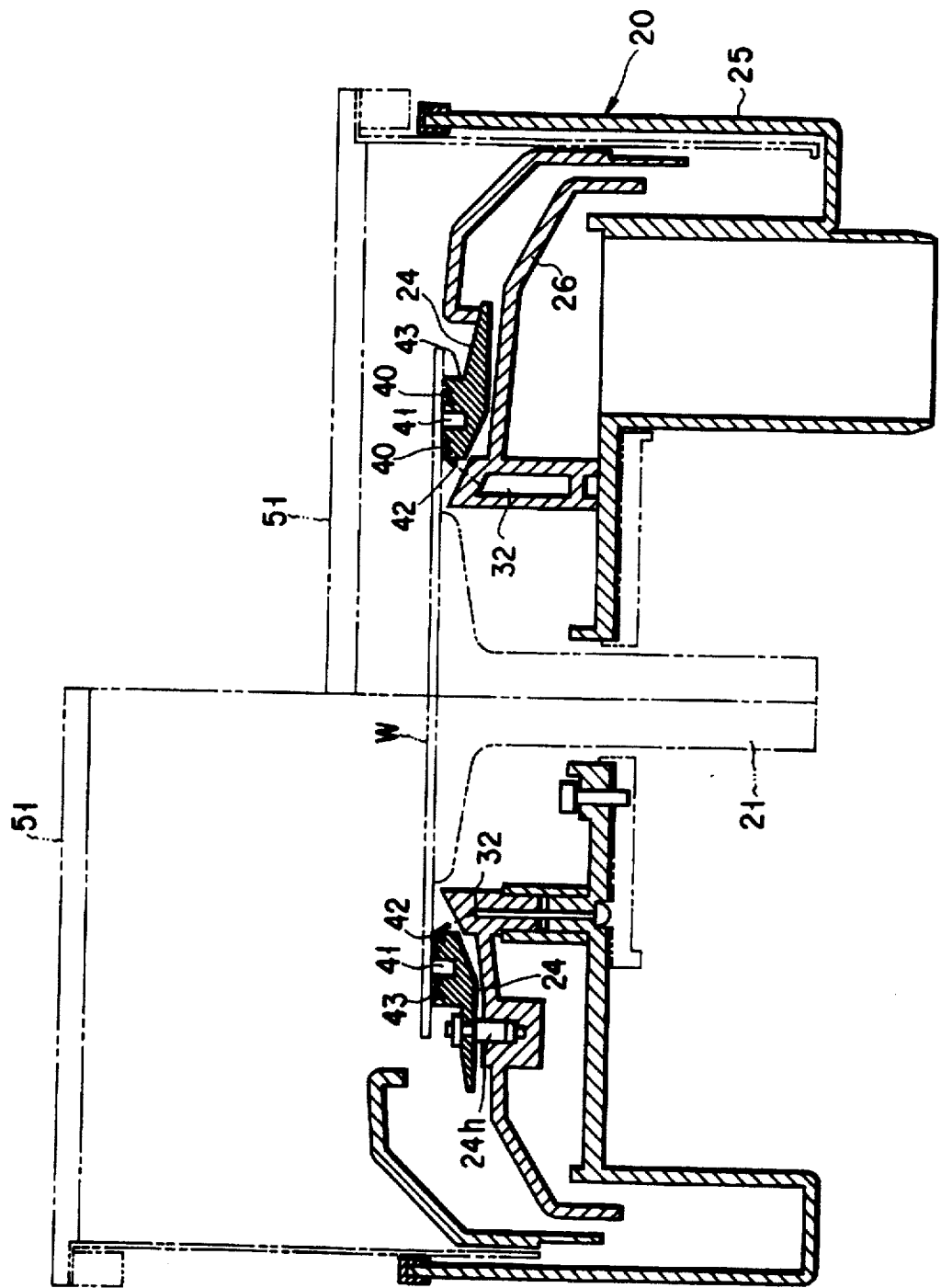
FIG. 3 is a cross-sectional view showing the developing apparatus according to the embodiment of the present invention.
Figure 4:
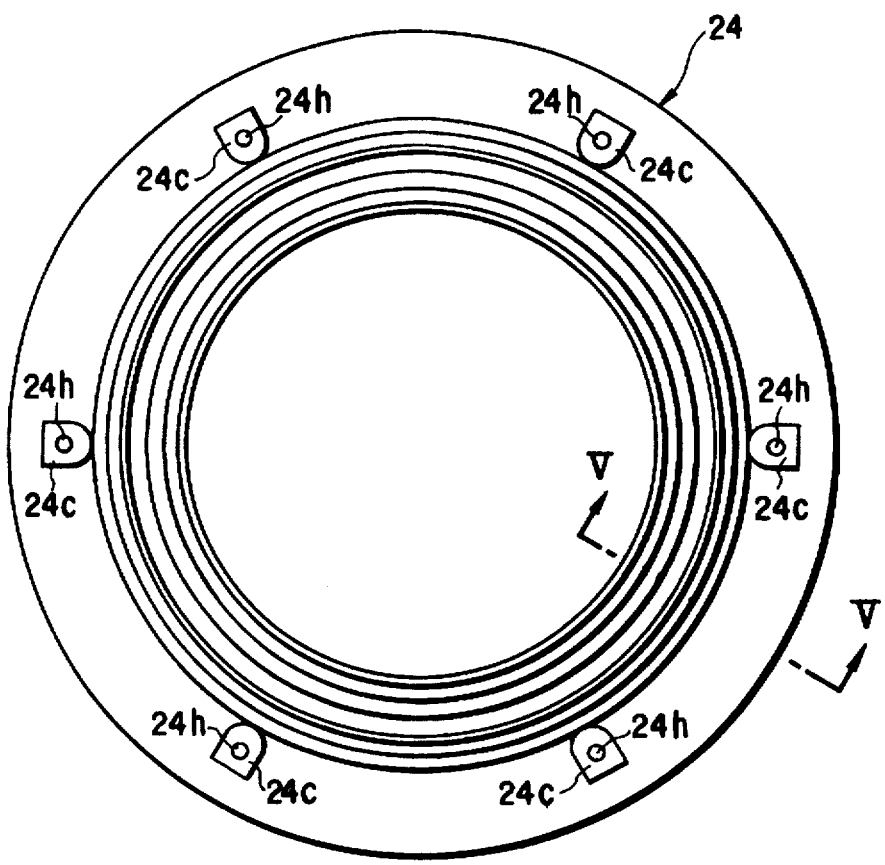
FIG. 4 is a plan view showing a liquid seal ring.
Figure 5:
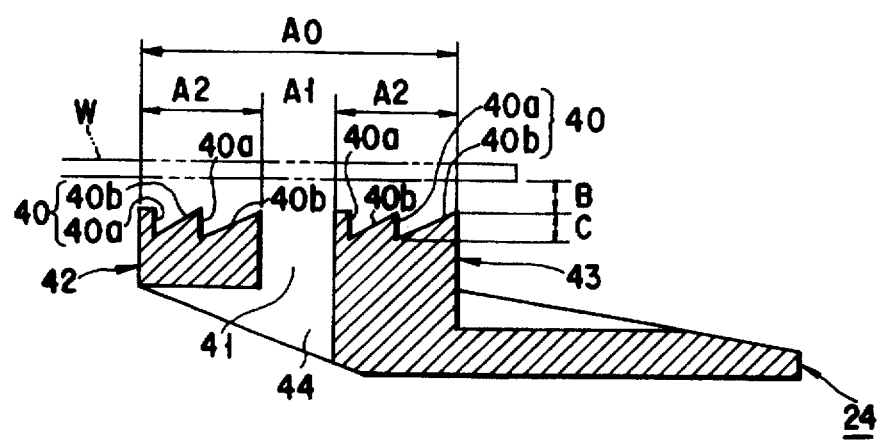
FIG. 5 is an enlarged view, in cross-section, showing the liquid seal ring.
Figure 6:
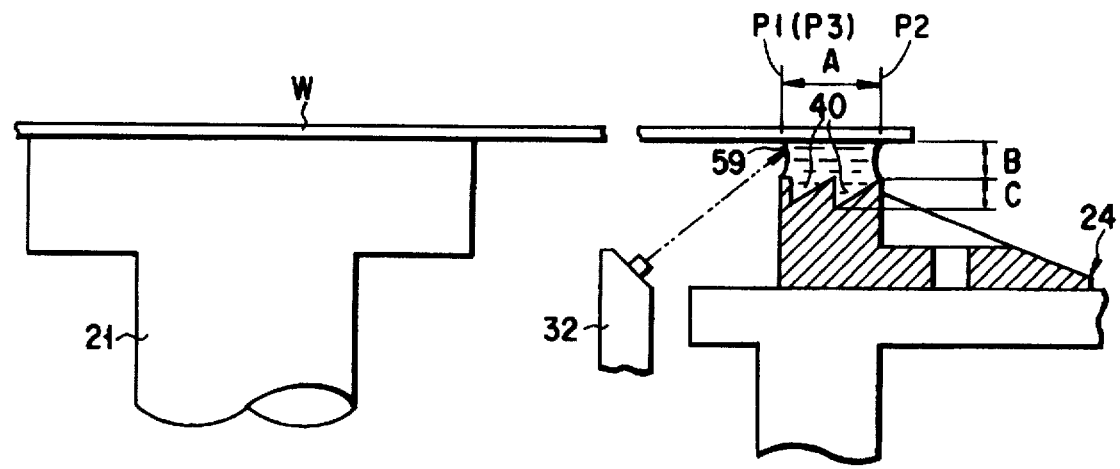
FIG. 6 is a cross-sectional view, partly taken away, showing a wafer on a spin chuck, a liquid seal ring and second washing solution nozzles in the developing apparatus according to the embodiment of the present invention.

An inner container 26 of the cup 20 is surrounded with an outer container 25. The outer container 25 is of a bottomed-cylindrical shape and the inner container 26 is of a ring-like shape. A liquid-seal ring 24 is mounted on the upper side of the inner container 26 by a plurality of bolts 24. As shown in FIGS. 4 and 13, a plurality of recesses 24c are formed at a flange portion 24b and a bolt hole 24d is formed in the recess 24c. As shown in FIG. 3, an upper cover 51 is disposed over the cup 20.

A developing solution (or developer) nozzle 23 and first washing solution nozzle 31 are provided on the upper area side of the apparatus 8. These nozzles 23 and 31 are supported by a conveying unit, not shown, in a way to be moved from a home position to a position just over the cup 20. The nozzles above are located at a home position when not in an operative state and at the position just over the cup 20 when in an operative position. The developing solution nozzle 22 is linear in configuration and has a length substantially the same as the diameter of the wafer W.

The nozzle 23 is connected to a fluid source 22 via a flexible pipe. A developing solution 50 whose concentration and temperature are controlled is held in the fluid source 22. The nozzle 31 is connected to a fluid source 30 via a flexible pipe (not shown). A washing solution (or rinse solution) 60 is held in the fluid source 30.

Second washing solution nozzles 32 are positioned at the rear surface side of the wafer. The nozzles 32 are connected via a corresponding pipe to the above-mentioned fluid source 30 for the washing solution 60. The nozzles 32 are provided near the rear surface of the wafer W such that their outlets are directed at the peripheral edge portion of the rear surface of the wafer W. The nozzle 32 is so supported on the button of the cup 20 as to enable fine adjustment to be made in the position and direction of its discharge hole.

The motor 33, elevator mechanism 34, fluid sources 22, 30, nozzle 23, first and second nozzle 31 and 32 are connected to the output side of the controller 35 to enable the controlling of these component parts. A temperature/humidity adjusting mechanism (not shown) is provided above the chamber 20 so that a gas stream is supplied in a temperature/humidity controlled state into the chamber 20.

The second washing solution nozzle 32 has preferably a plurality of nozzles, more preferably over four nozzles. This is because, with an increase in the number of nozzles 32, it is possible to quickly create a liquid film at a clearance 59 in continuous form.

The liquid seal ring 24 will be explained below with respect to FIGS. 4 to 6 and FIGS. 9A and 9B.

The liquid seal ring 24 is located on the rear surface side of the wafer W. A top face 40 of the liquid seal ring 24 is situated opposite and near the peripheral edge portion of the rear surface of the wafer to provide a ring-like clearance 59 of a distance B between the top face 40 and the rear surface of the wafer W. In order to stabilize the film of the washing liquid 60, the distance B of the clearance 59 is made as small as possible. If the distance B is made unduly smaller, there is a risk that the wafer W will contact with the top surface 24a at a time of spinning. The distance B is desirably in a range of 0.5 mm to 1.5 mm.

Figure 9A:
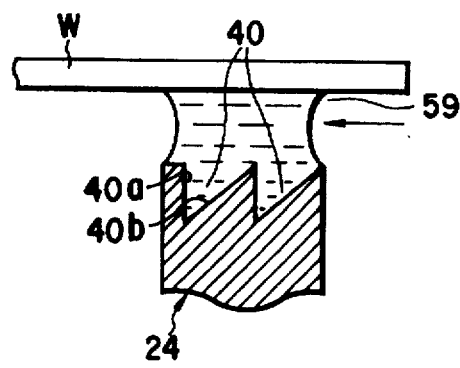
FIG. 9A and 9B are an enlarged, cross-sectional view, partly taken away, showing a wafer and liquid seal ring.

The liquid seal ring 24 has an inner ring portion 42 and an outer ring portion 43 in a concentric relation. An uneven top face 40 is formed on the inner and outer ring portions 42 and 43 and has two vertical walls 40a and two inclined walls 40b. The vertical wall 40a is situated orthogonal to a horizontal plane (wafer's rear surface) and extend outwardly. As shown in FIG. 9A, the vertical wall 40a prevents to intrude the developing solution 50 into more inward than the clearance 59.

Figure 9B:
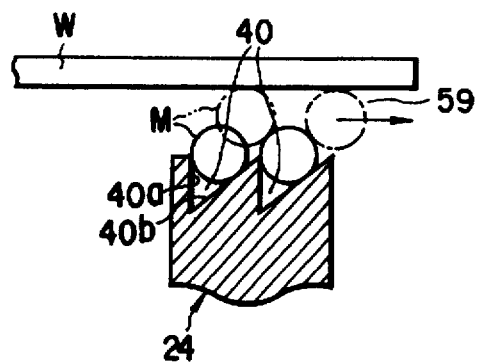

The wall 40b provides a gently inwardly inclined face relative to a horizontal surface (wafer's rear surface). As shown in FIG. 9B, the inclined wall 40b promotes the discharge of the developing solution 50 from the clearance 59. The inclination angle θ of the inclined wall 40b relative to the horizontal plane is preferably in a range of 15° to 30°. Further, the depth c of the uneven top face 40 is made preferably as shallow as about 1 to 2 mm.

A groove 41 is formed between the inner ring portion 42 and the outer ring portion 43. The groove 41 has a nearly uniform width and depth, noting that the width $A_1$ is 3 to 5 mm. The groove 41 is formed with six discharge outlets 44. The inner container 26 is disposed beneath the discharge hole 44. With the developing solution etc. removed from the clearance 59, a used solution drops through the respective hole 44 onto the upper surface of the inner container 26 and flows from there into the liquid discharge passage 29.

In order to continuously form a liquid film at the clearance 59, the width $A_2$ of the top face 40 of the inner and outer ring portions 42 and 43 needs to be made enough great. Since, in this case, the liquid film becomes unstable if the width $A_2$ of the top face 40 is below 5 mm, the lower limit value of the width $A_2$ is preferably 5 mm. If, however, the width $A_2$ of the top face 40 exceeds 15 mm, more amount of developing solution 50 is mixed into the liquid film of the washing solution 60 and it is preferable that the upper limit value of the width $A_2$ be 15 mm. At the inner and outer ring portions 42 and 43 of the present embodiment, the width $A_2$ of the top face 40 are respectively set to be 5 mm to 7 mm. Further, the whole width $A_0$ of the upper area of the liquid seal ring 24 is set to 15 mm to 17 mm.

The liquid seal ring 24 is made of an excellent water- and corrosion-resistant material such as vinyl chloride or ceramics. Further, the outer diameter of the outer ring portion 43 needs to be made smaller than the diameter of the wafer W by about 10 mm. This is because, if the top face 40 of the outer ring portion 43 is arranged more outside an orientation flat of the wafer W, the ring-like liquid film becomes unstable so that the liquid film is liable to be broken.

The present invention is not restricted only to the top face 40 alone of the shallowly uneven top face 40 and it may be possible to adopt top faces 24a, 24e, 24f, 24g of different shape. The top face 24a may be made flat as shown in FIG. 12. Further the top face 24e may be formed with three grooves in rectangular cross-section as shown in FIG. 13. The top surface 24f may be recessed as shown in FIG. 14. Further, the top face 24g may be inclined outwardly as shown in FIG. 15. The inclined angle θ of the top face 25g is desirably in a range of 1 to 5° and most desirably 2°. Since these top faces 24e, 24f, 24g and 40 provide a greater area of contact with the rinse 60, the rinse 60 is positively held at the area of the clearance 59 to ensure a stable ring-like liquid film. In the inclined type top face 24g, the developing solution 50 tends to flow outwardly of the liquid seal ring 24.

A developing method using the first embodiment will be explained below with reference to FIGS. 7 and 8A to 8D.

Figure 8A:
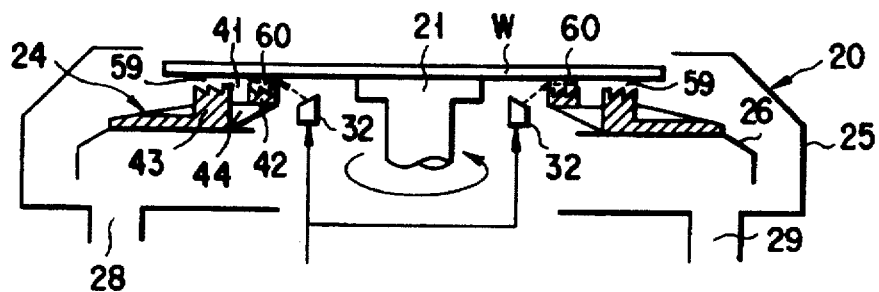
FIGS. 8A to 8D are cross-sectional views showing, in model form, a developing apparatus for explaining another developing method of the present invention.

A wafer W is coated with a photoresist and exposed with light. The wafer W is picked up by the main arm 5 from an exposure device (not shown) onto the developing apparatus 8. The wafer W is placed on the spin chuck 21. At that time, the main arm 5 positions the wafer W on and relative to the spin chuck 21 and the spin chuck 21 holds the wafer W in place in a sucked state (step S1). With the wafer rotated at low speed (step S2), the rinse 60 is supplied from the washing solution nozzle 32 into the clearance 59. As a result, the rinse 60 is created as a continuous liquid film at the clearance site as shown in FIG. 8A (step S3). For the case of an 8-inch diameter wafer W, the rotation speed of the wafer W is controlled in a range of, preferably, 10 to 100 rpm and, more preferably, 30 to 60 rpm (step S2).

Figure 8B:
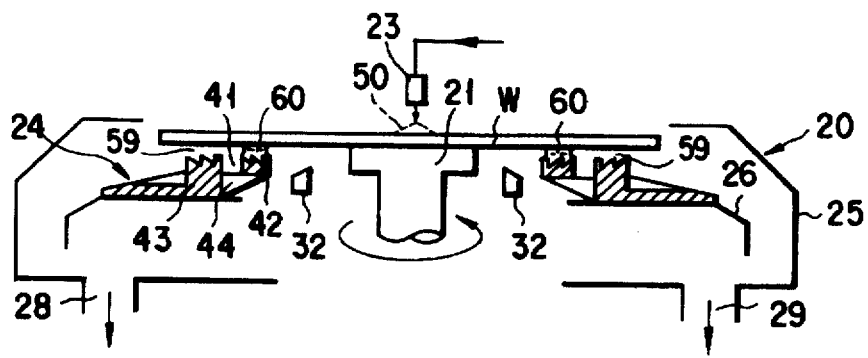

Then the rotation of the wafer W is stopped for a 0.3 second only (step S4). After the temporary stopping, a developing solution 50 is supplied by the nozzle 23 onto the upper surface of the wafer (the resist-coated surface) at step S6 as shown in FIG. 8B and, while doing so, the wafer W is rotated at a low speed of 30 rpm for one second only (step S7). As a result, the developing solution 50 is uniformly spread on the whole upper surface of the wafer W. In this case, the spraying time of the developing solution 50 may be set to be equal to, or shorter than, the low-speed rotation time at step S7. Further, the low-speed rotation time at step S7 may be set to be 2 seconds.

An exhaust operation is started, within the cup 20, between steps S4 and S6 (steps 5). The timing in which the exhaust operation is started is not necessarily restricted only to between steps S4 and S6 and it may be done at any time so long as being prior to step S6. Further, not only the exhaust pump 27 but also the liquid discharge pump, not shown, is started so that the liquid in the cup 20 is discharged to an outside.

Figure 8C:
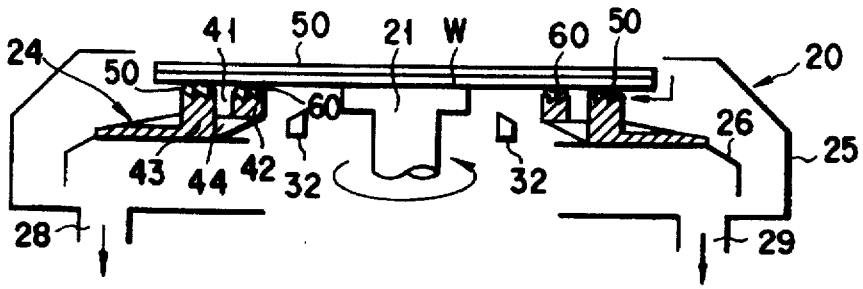

As shown in FIG. 8C the developing solution 50 is deposited on the upper surface of the wafer W and then the rotation of the wafer W is stopped for a while (step S8). The photoresist is developed during the time period in which the rotation of the wafer is stopped. The time of development is, for example, 50 seconds. During development, automatic control is carried out so that the temperature and humidity in the chamber 36 reach a given set value each.

During the developing step S8, the developing solution will be flowed from the upper surface side of the wafer onto the rear surface side around a periphery of the wafer W. However, the developing solution 50 is trapped by the outer portion of the clearance 59 and a continuous developing solution tending to flow from an upper surface side onto the rear surface side of the wafer around a peripheral edge flows downward, thus effectively preventing an intrusion of the developing solution from around the outer portion of the clearance 59 toward an inside. Even if the developing solution 50 is intruded onto the groove 41, it is quickly discharged via the discharge outlet 44. Further, since the inside clearance 59 and outside clearance 59 are spaced apart by the groove 41, the developing solution 50 is not substantially mixed with the developing solution 60 held at the inside clearance 59. As shown in FIG. 9A, the vertical wall 40a of the liquid seal ring 24 prevents an intrusion of the developing solution 50 and inhibits the developing solution 50 from intruding more toward an inside than the clearance 59. As shown in FIG. 9B, the inclined wall 40b of the liquid seal ring 24b promotes the discharge of the developing solution 50 from the clearance 59. For this reason, no developing solution 59 is deposited at all on the wafer's rear surface and spin chuck 21 situated more inward than the inside clearance 59.

Figure 8D:
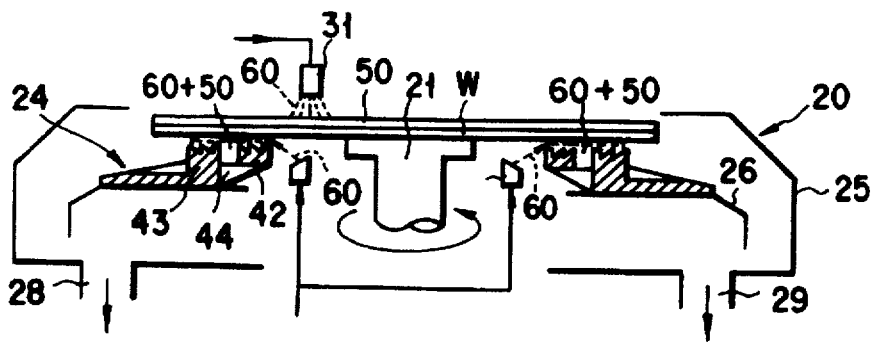

After the finishing of the developing process, the wafer W is rotated at a high speed of 2000 rpm and the developing solution 50 is shaken off the wafer W (step S9). As shown in FIG. 8D, with the wafer W rotated at high speed the rinse 60 is supplied by the first nozzle 31 onto the upper surface of the wafer W and the rinse 60 is supplied by the second nozzle 32 onto the rear surface of the wafer W so that both the surfaces of the wafer W are washed at step S10. By doing so, the developing solution 50 is completely removed from the wafer's upper surface and clearance 59.

Figure 10:
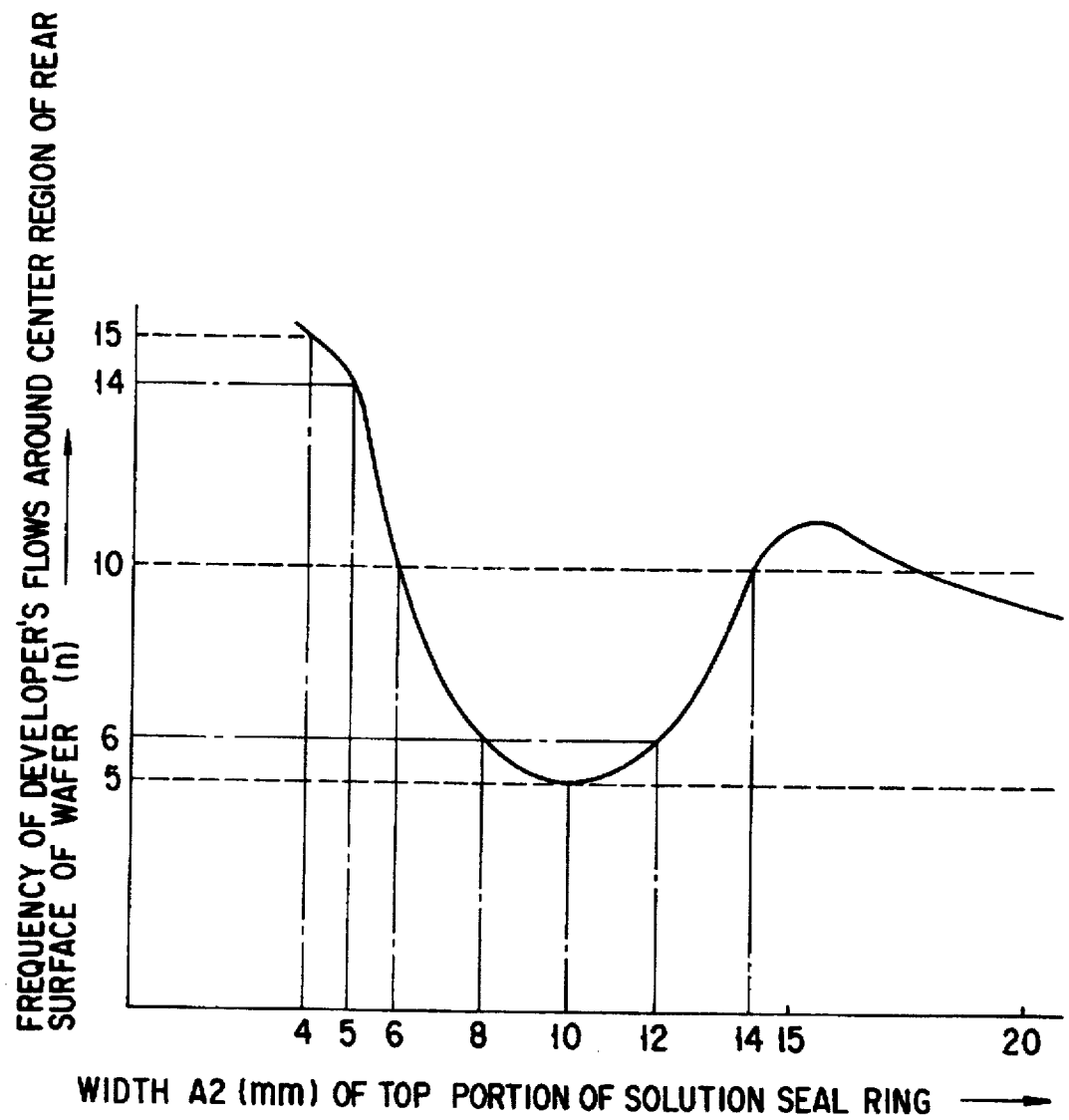
FIG. 10 is a characteristic curve showing a relation between a width A of a top face of the liquid seal ring and the frequency of developer's flows toward the center region of the wafer around its peripheral edge.

FIG. 10 is a graph showing a relation between the width $A_2$ (mm) of the top face of the liquid seal ring—the abscissa—and the frequency n—the ordinate—of developer's (developing solution's) flows around the peripheral edge toward the center region of the rear surface of each wafer, that is, a relation obtained under the following conditions with the use of sample wafers:

Conditions wafer W: a 6-inch diameter silicon wafer with a resist coated thereon;

clearance B: 1 mm developer: a surfactant-containing developer at a contact angle of below 3° relative to the rear surface of the wafer;

discharging of the developer: 1.8 kg/cm² (28.0 cc):

number of wafers processed: 15 sheets; and washing solution: pure water.

As evident from FIG. 10, when the width $A_2$ of the top face of the liquid seal ring was within a range of 5 mm to 15 mm, the "flowing-around" of the developing solution was able to be effectively prevented while, when the width $A_2$ was within a range of 6 to 14 mm, the frequency (occurrences) of the "flowing around" was able to be reduced to below 10 wafers. It has also been found that when the width $A_2$ of the top face of the liquid seal ring is within a range of 8 to 12 mm the frequency of such "flowing-around" can be reduced to below six sheets. For the width $A_2$ being 10 mm, the frequency was reduced to 5 wafers, that is, the lowest occurrence figure. It is to be noted that, for the width $A_2$ being 20 mm, the frequency is as small as 9 wafers. In this case, however, too wide area has to be washed and hence it has been found insufficient to wash the rear surface of the wafer after developing has been carried out, so that the developing solution was left on the rear surface of the wafer.

Similar tests were made with a varying clearance B size range of 0.5 mm to 1.5 mm, obtaining the following results. Those tests under the condition of the width $A_2$ of 14 mm at the liquid seal ring 24 for the clearance B of 0.5 mm and under the condition of the width $A_2$ of 6 mm at the liquid seal ring 24 for the clearance B of 1.5 mm revealed substantially the same results as set out above. Further, those tests under the condition of the width $A_2$ of 15 mm at the liquid seal ring 24 for the clearance B of 0.67 mm and under the condition of the width $A_2$ of 5 mm at the liquid seal ring 24 for the clearance B of 1.3 mm manifested substantially the same as as set out above.

A developing apparatus according to a second embodiment of the present invention will be explained below with reference to FIGS. 11, 12, 16, 17A to 17D and 18A to 18D. An explanation will be given blow about the second embodiment, though omitting an explanation on those corresponding to the counterparts of the first embodiment.

Figure 11:
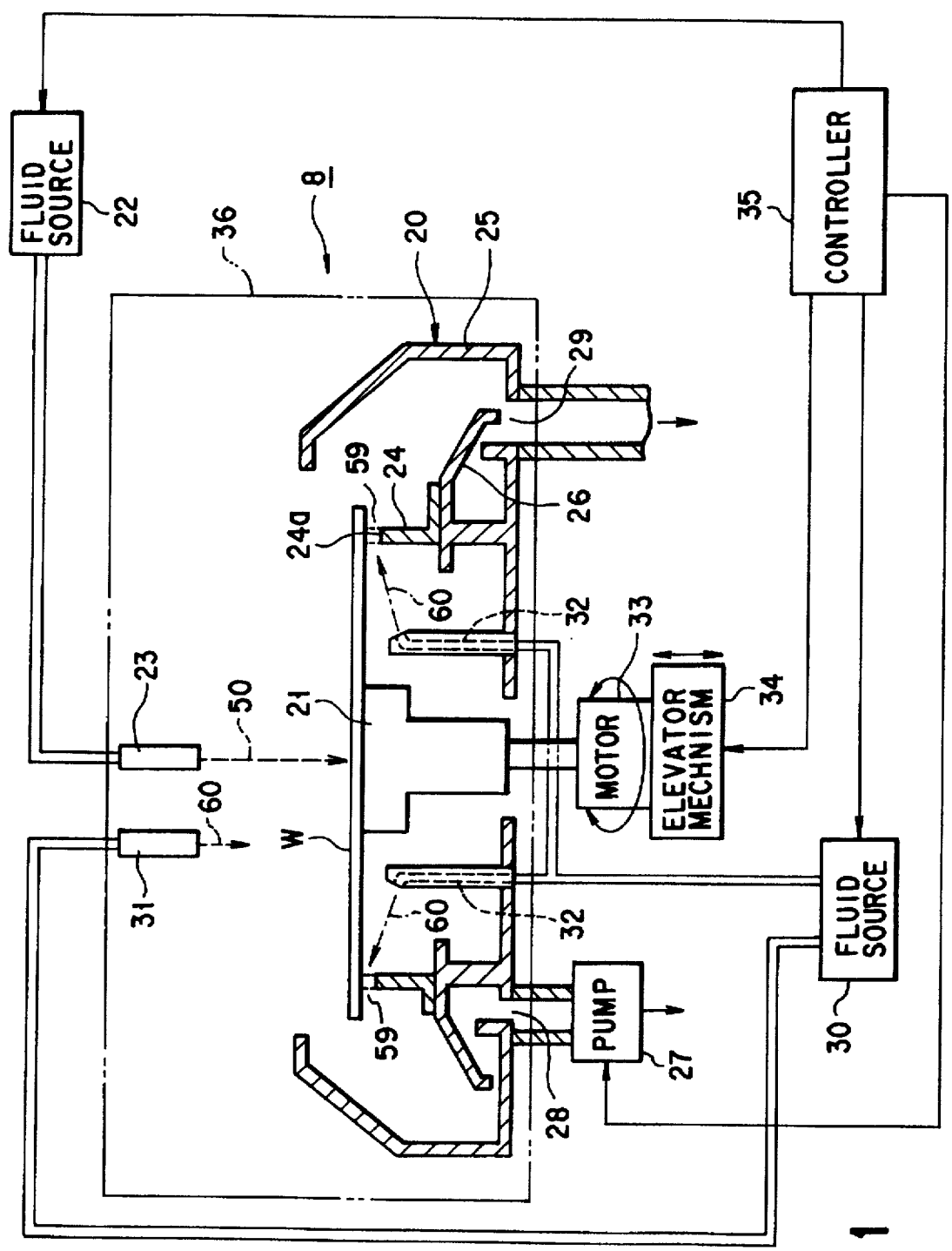
FIG. 11 is a cross-sectional, block diagram, partly taken away, showing a developing apparatus according to another embodiment of the present invention.

For the second embodiment, a liquid seal ring 24 has a flat top face 24a as shown in FIGS. 11 and 12. The liquid seal ring 24 is so provided as to have its flat top face 24a situated opposite the rear surface of the wafer W. A clearance 59 of a given size is defined between the top face 24a and the rear surface of the wafer W.

As shown in FIG. 12, a liquid jetting outlet of nozzles 32 is directed at a position $P_3$ on the rear surface of the wafer W. Desirably, the position $P_3$ is substantially aligned with an inner position $P_1$ of the top face 24a of the liquid seal ring 24a. By doing so, a continuous liquid film tends to readily create the clearance 59. Through the jetting of the washing solution 60 from the nozzle 32 the developing solution 50 can be positively removed from the clearance 59. The liquid seal ring 24 is so positioned that an outer position $P_2$ of the top face 24a is located more inward than an orientation flat of the wafer W.

A developing method using the second embodiment of the present invention will be explained below with reference to FIGS. 16 and 17A to 17D.

Figure 17A:
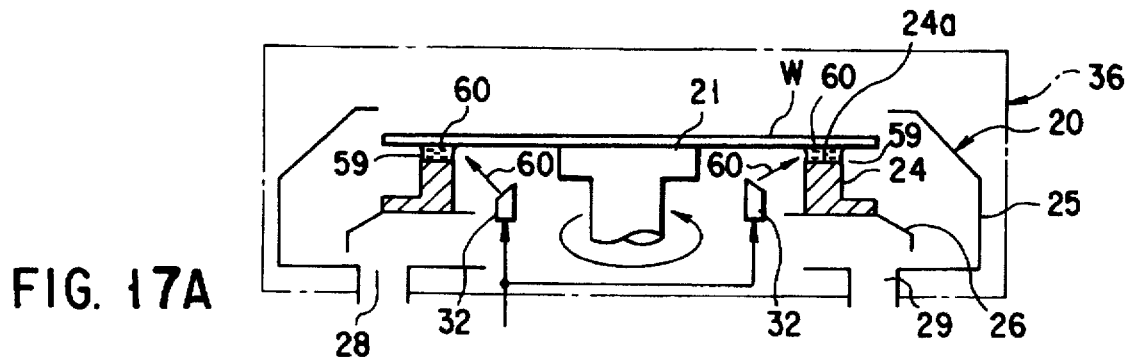
FIGS. 17A to 17D are cross-sectional views schematically showing, in model form, a developing apparatus for explaining another method of the present invention.

A wafer W is placed on a spin chuck 21 with a photoresist-coated side up and is held in place under suction (step S21). The wafer W is rotated at a low speed of 30 rpm (step S22). An exhaust operation is started in a chamber 36 (step S23). A rinse 60 is supplied by second nozzles 32 to the clearance 59 (step S24). The rinse 60 creates a continuous liquid film at the clearance 59 as shown in FIG. 17A. At the formation of the continuous liquid film, the rotation speed is in a range of, desirably, 10 mm to 100 rpm and, more preferably, 30 mm to 60 rpm.

Then the rotation of the wafer W is stopped at step S25. The exhausting of the chamber 36 is stopped and hence a hermetically sealed state is attained in the chamber 36 (step S26).

Figure 17B:
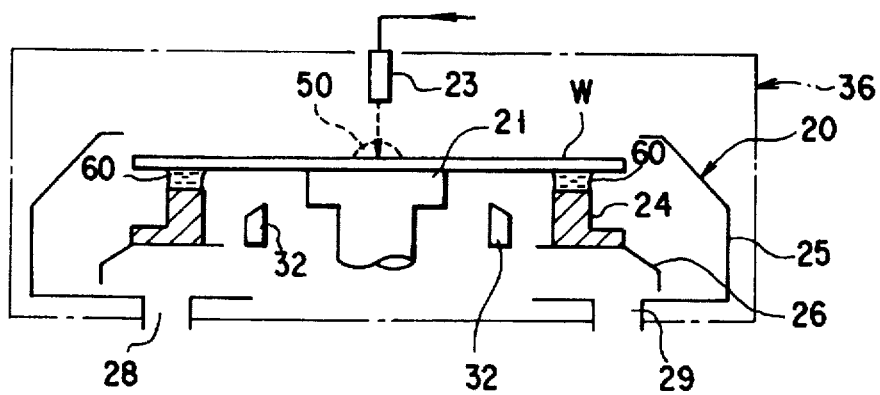

As shown in FIG. 17B, a developing solution 50 is supplied from a nozzle 23 onto the upper surface of the wafer W for about 0.5 second (step S27). By doing so, the photoresist—coated surface of the wafer W is covered with the developing solution 50 and a vapor atmosphere of the the developing solution 50 is created in the chamber 36. This vapor atmosphere is not necessarily formed there. Even in the case where there is no formation of such a vapor atmosphere, the photoresist on the wafer W is uniformly developed. Here it is only necessary that a hermetically sealed state be attained in the chamber 36. Since no air current is created around the wafer in the hermetically sealed chamber 36, the photoresist is uniformly developed there.

Figure 17C:
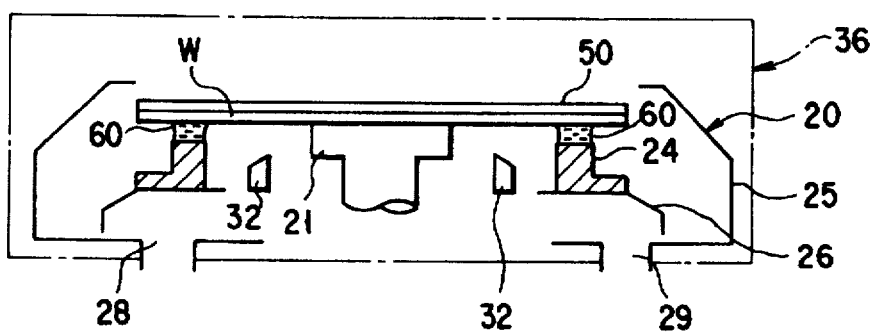

As shown in FIG. 17C, the wafer W is allowed to stand for about 60 seconds under the vapor atmosphere of the developing solution so that the coated photoresist is developed. The spraying time of the developing solution 50 may be longer than 0.5 second. Further, the exhausting of the chamber 36 may be started earlier than at step S23. Further, the exhausting of the chamber 36 may be stopped earlier than at step 26. Together with an exhaust pump a liquid discharge pump (not shown) is also started to discharge a liquid in a cup 20 to an outside. In the developing process, automatic control is so effected as to set the temperature and humidity in the chamber 36 to predetermined values.

With the rotation of the wafer W stopped and the exhausting of the chamber 36 stopped, developing is thus made under a vapor atmosphere of the developing solution. By doing so, ideally uniform developing can be carried out almost without involving any air current in the chamber 36. It is to be noted that the temperature and humidity in the processing atmosphere are automatically controlled to reach predetermined values.

In the developing process, the developing solution 50 tends to flow from the upper side onto the rear surface of the wafer around the peripheral edge. Since, however, the developing solution is trapped at the clearance 59 and this continuous solution 50 flows down without such "flowing around" occurrence, it is, therefore, possible to effectively prevent an intrusion of the developing solution 50 more inward than the clearance 59. For this reason, the developing solution 50 is not deposited on the wafer's rear surface and spin chuck 21 situated inward from the clearance 59.

Figure 17D:
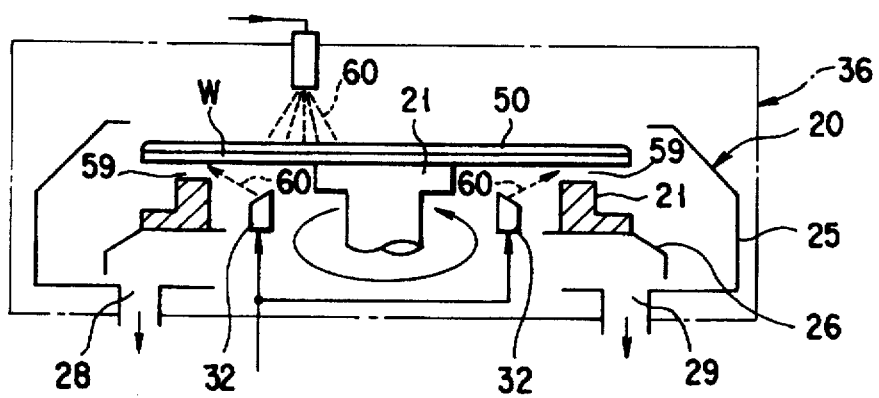

At the finishing of the developing process, the wafer W is rotated at a high speed of 2000 rpm to shake the developing solution 50 off the wafer W (step S28). As shown in FIG. 17D, with the wafer W rotated at high speed, the rinse 60 is supplied by a first nozzle 31 onto the wafer W and the rinse 60 is supplied by the nozzles 32 onto the rear surface of the wafer W so that both the surfaces of the wafer W are washed (step S29). By doing so, the developing solution 50 is completely removed from the wafer's upper surface and clearance 59.

A developing method using a third embodiment of the present invention will be explained below with reference to FIGS. 18A to 18D and 7.

This method is directed to the use of the the third embodiment substantially the same as the first embodiment. In this connection it is to be noted that the third embodiment is different from the first embodiment in terms of its developing apparatus.

Figure 18A:
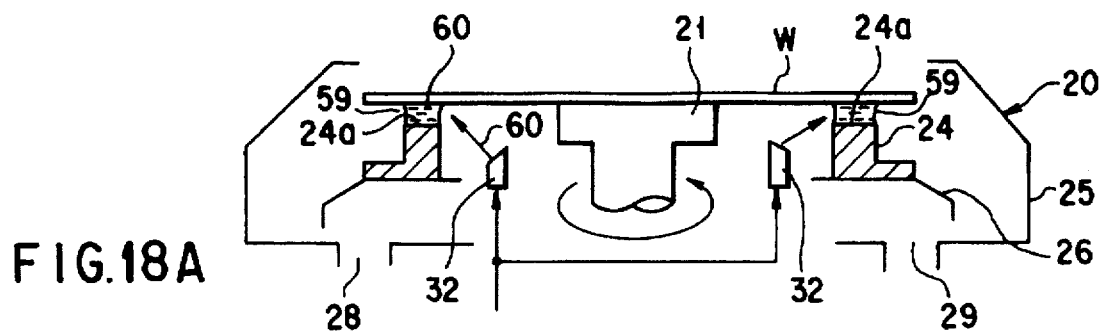
FIGS. 18A to 18D are cross-sectional views diagrammatically showing, in model form, a developing apparatus for explaining another method of the present invention.

With a photoresist-coated surface of a wafer W up, the wafer W is placed on a spin chuck 21 and held in place under suction (step S1). The wafer W is rotated at a low speed of 30 rpm (step S2) and, while this is done, a rinse 60 is directed at a clearance 59 from second nozzles 32. As a result, a continuous liquid film from the rinse 60 is created as shown in FIG. 18A (step S3). The number of rotations at the creation of the continuous liquid film is in a range of, desirably, 10 to 100 rpm and more preferably 30 to 60 rpm.

Figure 18B:
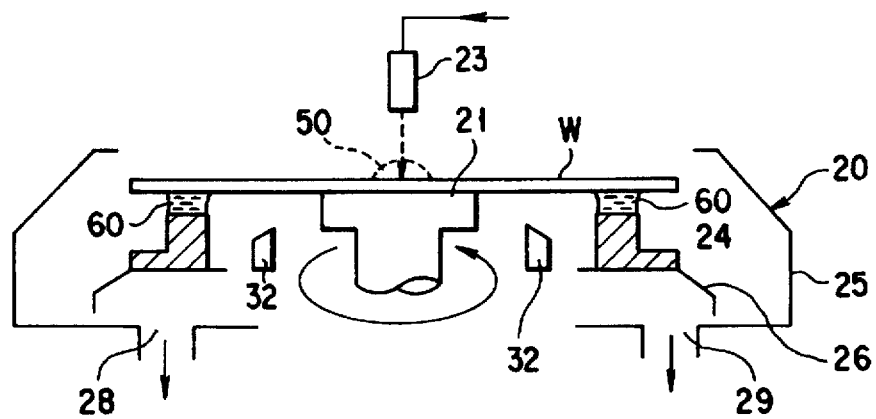

Then the rotation of the wafer W is stopped for 0.3 second (step S4). After this temporary stopping, as shown in FIG. 18B, a developing solution 50 from a nozzle 23 is supplied onto the upper surface (resist-coated surface) of the wafer W (step S6) and the wafer W is rotated at a low speed of 30 rpm for one second only (step S7). As a result, the developing solution 50 is uniformly spread on the upper surface of the wafer 50. In this case, the time for which the developing solution 50 is supplied may be made equal to, or smaller than, the lower-speed rotation time at step S7. The low-speed rotation time at step S7 may be two seconds.

Between steps S4 and S6, the exhausting of a cup 20 is started (step S5). Starting this exhausting operation is not necessarily set at a time only between steps S4 and S6 and may be set at any time so long as it is prior to step S6. Further, not only an exhaust pump 27 but also a liquid discharge pump, not shown, is started to discharge the liquid in the cup 20 to an outside.

Figure 18C:
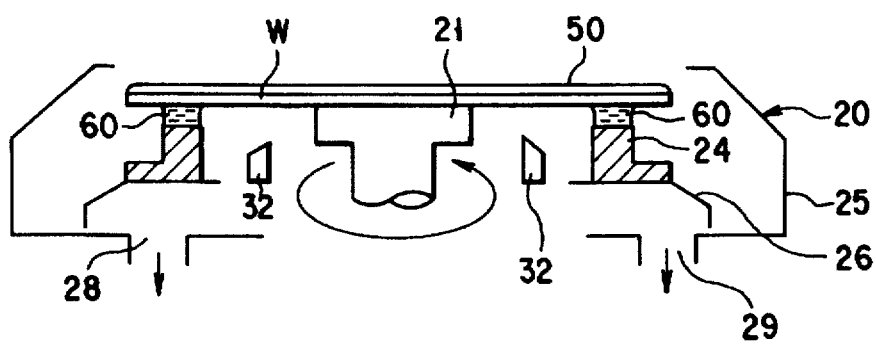

As shown in FIG. 18C, the developing solution 50 is deposited as a liquid film on the upper surface of the wafer W and then the rotation of the wafer W is stopped for a while (step S8). The photoresist is developed during a time in which the rotation of the wafer is stopped. The developing time is set to, for example, 50 seconds. During the developing process, automatic control is so made as to set the temperature and humidity in the chamber 36 to initially determined values.

During the developing process, the developing solution 50 tries to flow from the upper surface side to the rear surface of the wafer around a peripheral edge. Since, however, the developing solution 50 is trapped by the clearance 59 and its continuous developing solution 50 flows downward, it is possible to effectively prevent an intrusion of the developing solution 50 more inward than the clearance 59 so that the developing solution 50 is not deposited on the wafer's rear end surface and spin chuck 21 situated inward from the clearance 59.

Figure 18D:
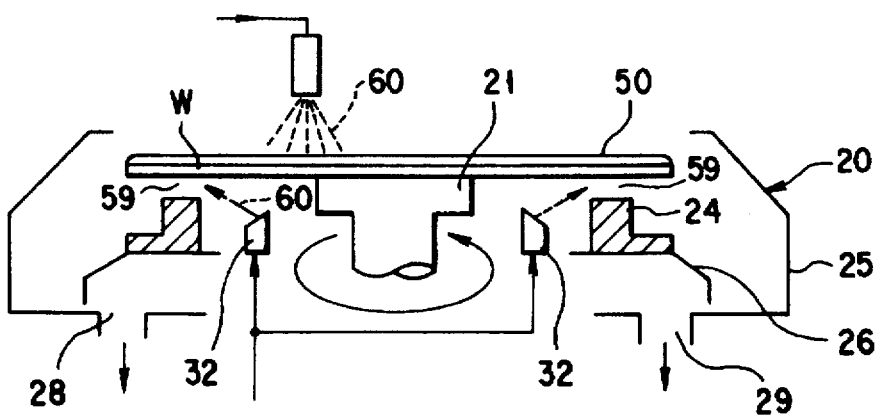

After the finishing of the developing step S8, the wafer W is rotated at a high speed of 2000 rpm to shake the developing solution 50 off the wafer W (step S9). With the wafer W rotated at high speed, a rinse 60 is sprayed by a first nozzle 31 onto the upper surface of the wafer W and the rinse 60 is sprayed by the second nozzles onto the rear surface of the wafer W, both the surfaces of the wafer W are washed (step S10) as shown in FIG. 18D. By doing so, the developing solution 50 is completely removed from the wafer's upper surface and clearance 59.

Although, in the above-mentioned embodiment, the present invention has been explained as being applied to the developing process of the semiconductor wafer, the present invention may also be applied to an LCD substrate.

What is claimed is:

1. A developing apparatus for developing a photoresist-coated on substrate, comprising:

a spin chuck having a mount smaller in size than the substrate and adapted to be spin-driven with the photoresist-coated substrate surface held upward;

a cup surrounding the substrate on the mount of the spin chuck;

a developing solution nozzle for applying a developing solution on the photoresist-coated substrate held on the mount;

a first washing solution nozzle for applying a washing solution to the photoresist-coated surface of the substrate held on the mount;

a second washing solution nozzle for applying the washing solution to a rear surface of the substrate on the mount;

a liquid seal ring mounted substantially coaxial with the spin chuck and having a diameter greater than the mount and smaller than the substrate; and a liquid film forming section provided on an upper end of the liquid seal ring and located near and opposite a periphery of a rear surface of the substrate on the mount to provide a clearance relative to the periphery of the rear surface of the substrate, wherein the liquid film forming section includes a first wall portion situated substantially orthogonal to the rear surface of the substrate and in an outwardly facing relation, and a second wall portion gently inclined relative to the rear surface of the substrate and situated in an inwardly facing relation, the liquid film forming section creates an annular continuous washing solution film at the clearance, the first wall portion prevents the developing solution from intruding more inward than the clearance, and the second wall portion promotes a discharge of the developing solution from the clearance.

2. The developing apparatus according to claim 1, wherein the second washing nozzle is located inward of the liquid seal ring.

3. The developing apparatus according to claim 1, wherein four second washing solution nozzles are provided for applying the washing solution to the rear surface of the substrate and each of said four second washing solution nozzles is located inward of the liquid seal ring.

4. The developing apparatus according to claim 1, wherein the liquid film forming section has a width range of 5 to 15 mm and the clearance is defined in a range of 0.5 to 1.5 mm.

5. The developing apparatus according to claim 1, wherein the liquid film forming section traps the washing solution supplied from the second washing solution nozzle to the clearance to create the annular continuous washing solution film.

6. The developing apparatus according to claim 1, wherein the first and second wall portions have recesses and projections at the liquid film forming section.

7. The developing apparatus according to claim 1, wherein the substrate is comprised of a semiconductor wafer with an orientation flat and the liquid film forming section faces the rear surface of the substrate at a location radially inward of the orientation flat.

8. The developing apparatus according to claim 1, further comprising a second liquid film forming section provided coaxial with and outward relative to said liquid film forming section as the first liquid film forming section, the second liquid film forming section trapping that developing solution flowing onto the rear surface of the substrate around a periphery.

9. The developing apparatus according to claim 8, wherein a groove is defined between the first and second liquid film forming sections.

10. The developing apparatus according to claim 9, further comprises a liquid discharge passage provided below the cup and communicating with the groove.

11. A developing apparatus for developing a photoresist-coated substrate, comprising:

a spin chuck having a mount smaller in size than the substrate and adapted to be spin-driven with the photoresist-coated substrate surface held upward;

a cup surrounding the substrate on the mount of the spin chuck;

a developing solution nozzle for applying a developing solution on the photoresist-coated substrate held on the mount;

a first washing solution nozzle for applying a washing solution to the photoresist-coated surface of the substrate held on the mount;

a second washing solution nozzle for applying the washing solution to a rear surface of the substrate on the mount;

a liquid seal ring mounted substantially coaxial with the spin chuck and having a diameter greater than the mount and smaller than the substrate; and a liquid film forming section provided on an upper end of the liquid seal ring and located near and opposite a periphery of the rear surface of the substrate to provide a clearance relative to the periphery of the rear surface of the substrate, wherein the liquid film forming section has a substantially flat surface to create an annular continuous washing solution film at the clearance.

12. The developing apparatus according to claim 11, wherein the flat surface of the liquid film forming section is substantially parallel to the rear surface of the substrate.

13. The developing apparatus according to claim 11, wherein the flat surface of the liquid film forming section is substantially inclined relative to the rear surface of the substrate.

* * * * *